| (12) United States Patent | (10) Patent No.: US 6,803,664 B2 |
| Murayama | (45) Date of Patent: Oct. 12, 2004 |

(54) SEMICONDUCTOR PACKAGE

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/123,211

(22) Filed: Apr. 17, 2002

(65) Prior Publication Data

US 2002/0158341 A1 Oct. 31, 2002

(30) Foreign Application Priority Data

Apr. 27, 2001 (JP) ........................................ 2001-130840

(51) Int. Cl.⁷ .................... H01L 29/40; H01L 31/00; H01L 21/49; H01R 12/04; H05K 7/02; H05K 1/18
(52) U.S. Cl. .................. 257/779; 257/777; 257/459; 257/664; 257/737; 257/738; 438/612; 438/614; 174/261; 174/263; 361/777; 361/778
(58) Field of Search ................ 257/778–79, 777, 257/737, 738, 459, 664, 780, 786, 734, 692, 693, 697; 438/612, 614; 174/263, 261; 361/777, 768

(56) References Cited

U.S. PATENT DOCUMENTS

| 4,416,054 A | * | 11/1983 | Thomas et al. ............... 438/60 |
| 4,998,159 A | * | 3/1991 | Shinohara et al. .......... 361/809 |
| 5,436,197 A | * | 7/1995 | Hause ........................ 438/612 |
| 5,567,648 A | * | 10/1996 | Gupta ........................ 438/616 |
| 5,598,036 A | * | 1/1997 | Ho ............................. 257/738 |
| 5,677,575 A | * | 10/1997 | Maeta et al. ................ 257/778 |
| 6,018,462 A | * | 1/2000 | Sakuyama .................. 361/777 |
| 6,118,180 A | * | 9/2000 | Loo et al. ................... 257/737 |
| 6,191,023 B1 | * | 2/2001 | Chen ........................... 438/612 |
| 6,232,668 B1 | * | 5/2001 | Hikita et al. ................. 257/777 |
| 6,525,429 B1 | * | 2/2003 | Kovac et al. ................ 257/778 |
| 2001/0008309 A1 | * | 7/2001 | Iijima et al. ................ 257/737 |

FOREIGN PATENT DOCUMENTS

| JP | 54104286 | * | 8/1979 |
| JP | 60-7758 | * | 1/1985 |
| JP | 64-51639 | * | 2/1989 |
| JP | 03105995 | * | 5/1991 |
| JP | 04274388 | * | 9/1992 |

* cited by examiner

Primary Examiner—Kamand Cuneo
Assistant Examiner—James M. Mitchell
(74) Attorney, Agent, or Firm—Staas & Halsey LLP

(57) ABSTRACT

A semiconductor package provided with an interconnection layer including an interconnection pattern and pad formed on an insulating substrate or insulating layer, a protective layer covering the interconnection layer except at the portion of the pad and the insulating substrate or insulating layer, and an external connection terminal bonded with the pad exposed from the protective layer, the pad to which the external connection terminal is bonded being comprised of a plurality of pad segments, sufficient space being opened for passing an interconnection between pad segments, and the pad segments being comprised of at least one pad segment connected to an interconnection and other pad segments not connected to interconnections.

7 Claims, 9 Drawing Sheets

Fig. 4
(a)
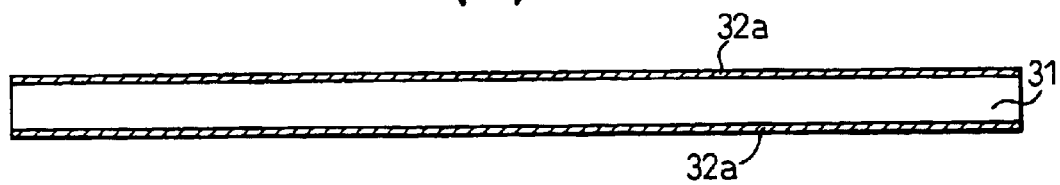
(b)
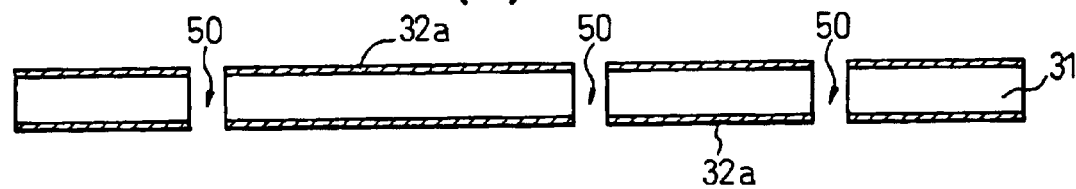
(c)
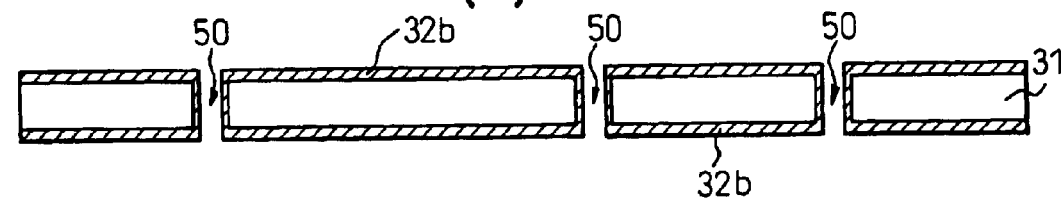
(d)
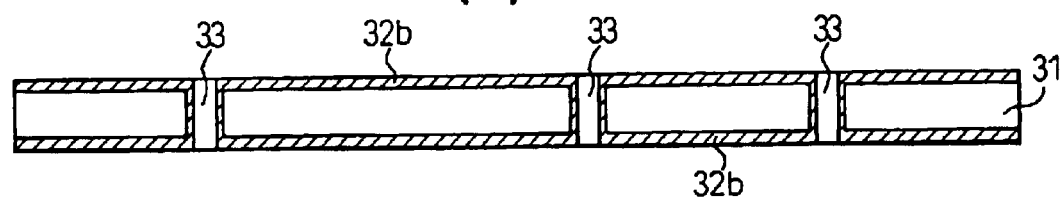
(e)
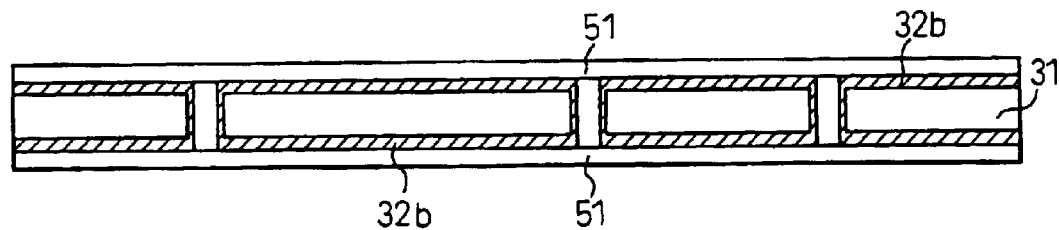

Fig. 5
(a)
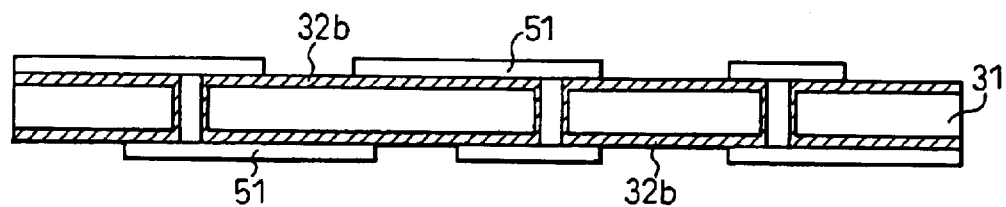
(b)
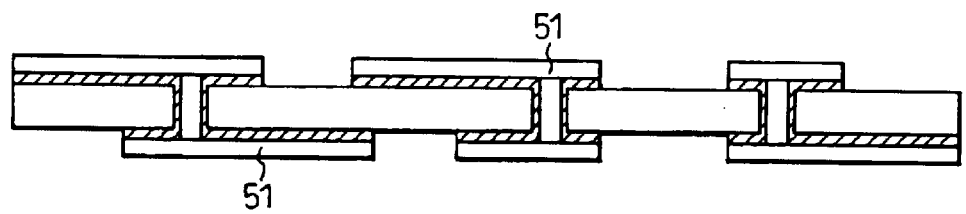
(c)
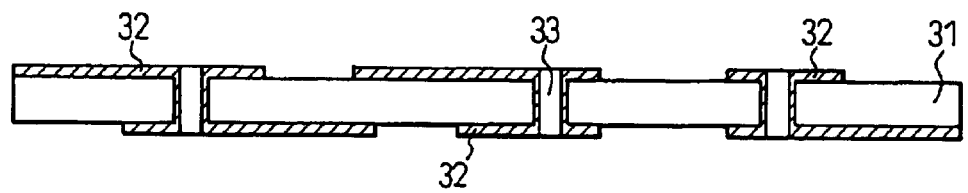
(d)
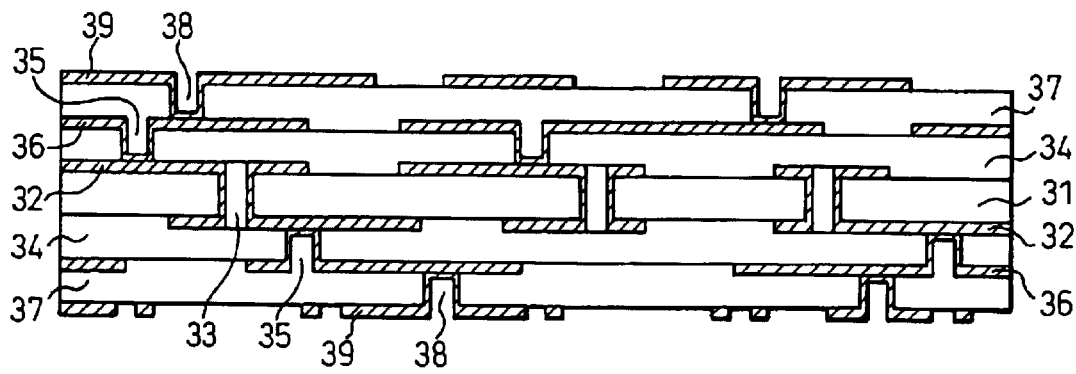

Fig. 6
(a)
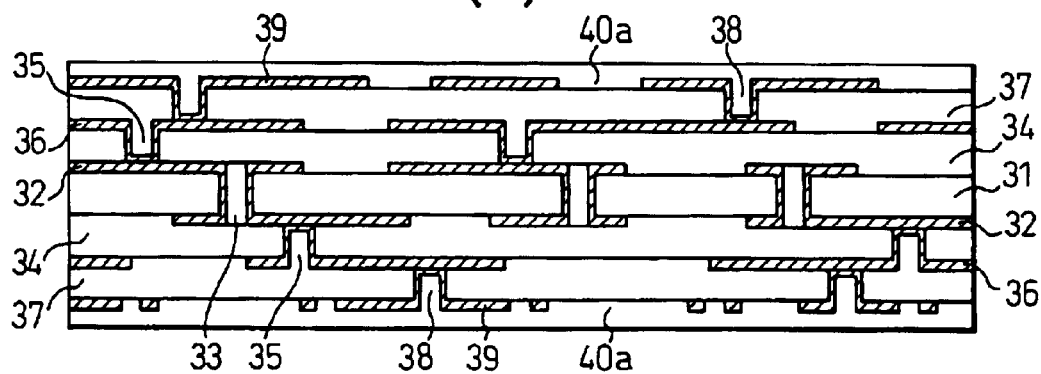
(b)
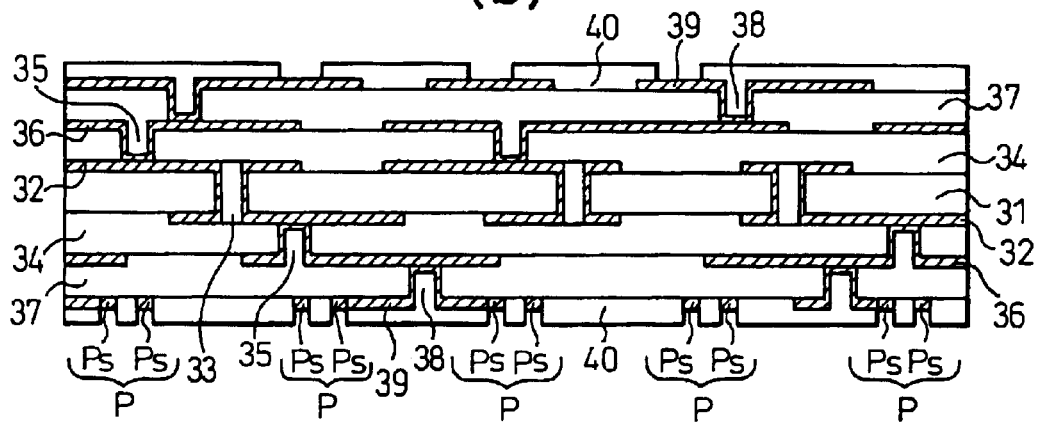
(c)
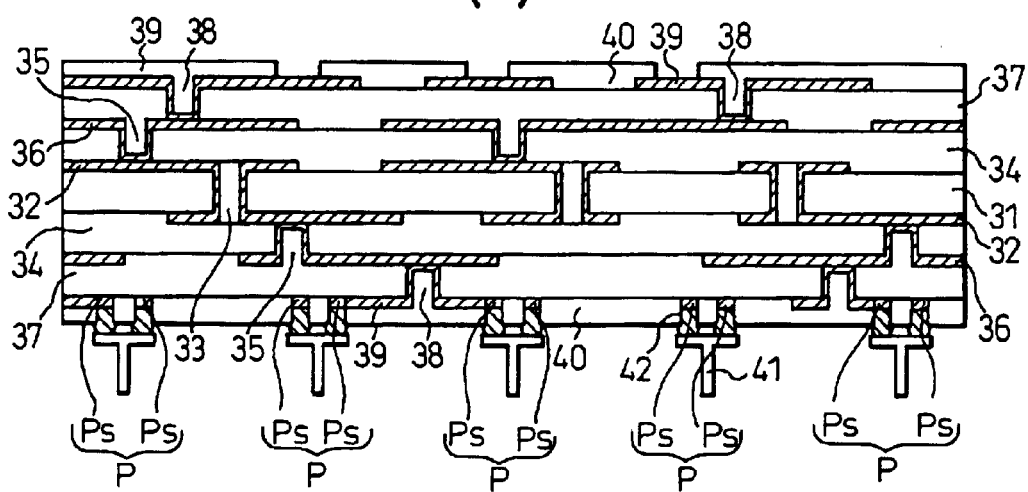

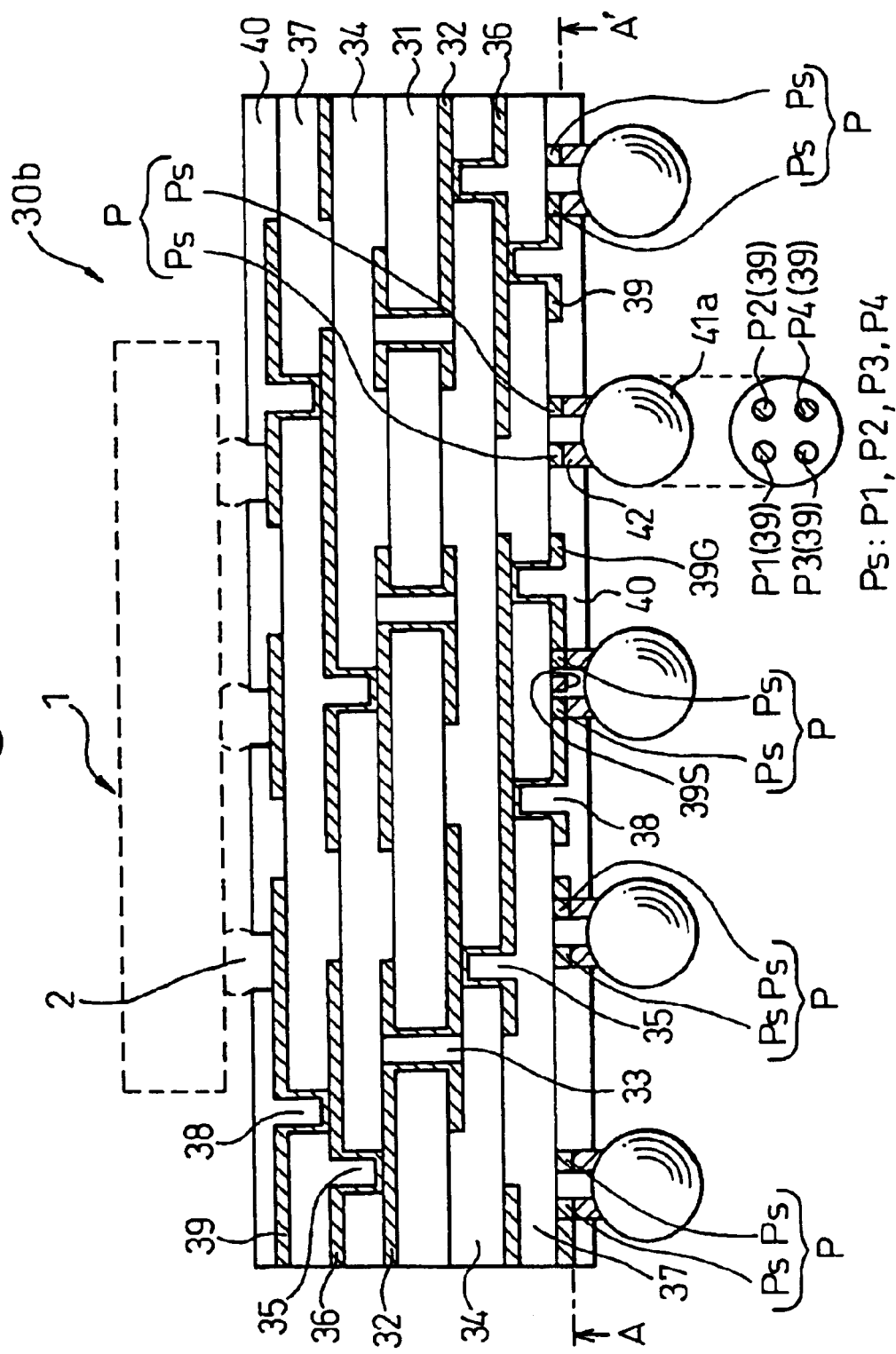

SEMICONDUCTOR PACKAGE

BACKGROUND OF THE INVENTION

1. Field of the Invention

The present invention relates to a package for mounting a semiconductor chip (hereinafter called a "semiconductor package"), a process for producing the same, and a semiconductor module using the same, more particularly relates to the structure of an external connection terminal for providing electrical connection with a motherboard or other mounting board when mounting a semiconductor package on a board, specifically to the shape of a pad to which an external connection terminal is bonded.

2. Description of the Related Art

FIG. 1 is a schematic sectional view of a semiconductor package of the related art. A semiconductor package 10, shown here as a multilayer printed circuit board, mounts a semiconductor chip 1 shown by the broken lines through its electrode terminals 2. The semiconductor package 10 is provided with a core board 11, conductor layers 12 including interconnection patterns and pads formed on the two surfaces of the core board 11, a resin 13 filled in through holes of the core board 11, second resin layers 14 of the printed circuit board, via holes 15 formed in the resin layers 14, conductor layers 16 including interconnection patterns and pads formed on the resin layers 14, third resin layers 17 of the printed circuit board, via holes 18 formed in the resin layers 17, conductor layers 19 including interconnection patterns and pads formed on the resin layers 17, protective films 20 formed on the resin layers 17 and conductor layers 19 other than portions of the pads P (19) of the conductor layers 19, pins 21 provided as external connection terminals, and solder 22 for bonding the pins 21 to the pads P (19) of the conductor layer 19 exposed from the lower protective film 20.

The shapes of the pads P (19) of the conductor layer 19 exposed from the lower protective film 20 are shown schematically (by the hatchings) as seen planarly along the line A–A' in the semiconductor package 10. As illustrated, one pad P is formed for each pin 21.

FIG. 2 is a schematic view of an example of the layout of interconnections in the semiconductor package 10. The interconnections (signal lines WS, power line WP, and ground line WG) and pads P are formed from parts of the conductor layers 19 formed by patterning (FIG. 1). The interconnections (WS, WP, and WG) are connected to corresponding pads P (FIG. 2) and further are connected to pins 21 from the pads through solder 22 (FIG. 1).

That is, in a semiconductor package of the related art, one interconnection was connected to one external connection terminal (pin) through one pad.

In recent years, along with the demand for greater integration of semiconductor chips, greater density of interconnections and more pins have been demanded from semiconductor packages mounting them. At the same time, the packages are being asked to be made smaller and thinner. Along with this, the space between pads to which the external connection terminals are bonded is becoming smaller (in the example of FIG. 2, 800 μm). The laying of interconnections at the same interconnection layer is therefore becoming more difficult space-wise.

Various methods are therefore being applied to deal with this. One of these methods is to widen the space between pads to which the external connector terminals are bonded so as to secure enough space for laying the required interconnections.

Another method is to utilize two or more interconnection layers connected to each other through via holes and lay the interconnections over the interconnection layers and through the via holes when laying the interconnections at the same interconnection layer is difficult.

In the above way, in a semiconductor package of the related art, various methods have been applied to enable the required interconnections to be laid. All of these methods, however, still suffer from problems.

In the method of increasing the space between pads for securing space for laying the interconnections, if trying to keep the number of external connection terminals provided (that is, the number of pads provided) the same, the problem arises that the semiconductor package becomes relatively large in size. This runs counter to the current demand for smaller sized packages. Conversely, if trying to increase the space between pads without changing the package size, the number of the external connection terminals provided has to be reduced. This blocks the greater density of interconnections.

As a method for providing the required number of external connection terminals and securing sufficient space between pads without changing the size of the package, it may be considered to reduce the size of the individual external connection terminals (that is, the size of the individual pads).

With this method, however, it is not possible to secure sufficient reliability of connection since the mechanical bonding strength between the resultantly much smaller external connection terminals and the corresponding resultantly much smaller pads is small. Further, since the external connection terminals are small in size, when mounting the package to the motherboard or other mounting board as well, the bonding strength of the external connection terminals of the package and the mounting board is small and sufficient reliability of connection cannot be obtained.

On the other hand, with the method of using two or more interconnection layers connected through via holes and laying the interconnections over the interconnection layers and through the via holes, since the interconnections which should inherently be laid on the outermost interconnection layers including the pads to which the external connection terminals are bonded (in the example of FIG. 1, the conductor layers 19) are laid with other connection layers through the via holes, there is the disadvantage of an inevitable increase in the number of interconnection layers. This leads to an increase in the thickness of the package and runs counter to the current demand for thinner semiconductor packages.

Further, in current semiconductor packages where greater density is being demanded, even if interconnections can be laid at the same interconnection layer, the interconnection patterns are close to each other, so crosstalk may occur between the interconnections, the potential of the power line etc. may fluctuate, or other problems may occur. In particular, in a package mounting a high frequency use semiconductor chip for which a high speed switching operation is demanded, cross-talk noise easily occurs along with the rise in frequency or switching noise occurs due to the high speed on/off operation of the switching element. Due to this, the potential of the power line etc. easily fluctuates.

SUMMARY OF THE INVENTION

An object of the present invention is to provide a semiconductor package device raising the freedom of layout of interconnections, facilitating greater compactness and thinness, securing sufficient reliability of connection, and contributing to the reduction of cross-talk noise etc., a process for producing the same, and a semiconductor module using that semiconductor package.

To achieve the above object, according to a first aspect of the present invention, there is provided a semiconductor package provided with an interconnection layer including an interconnection pattern and pad formed on an insulating substrate or insulating layer, a protective layer covering the interconnection layer except at the portion of the pad and the insulating substrate or insulating layer, and an external connection terminal bonded with the pad exposed from the protective layer, the pad to which the external connection terminal is bonded being comprised of a plurality of pad segments, sufficient space being opened for passing an interconnection between pad segments, and the pad segments being comprised of at least one pad segment connected to an interconnection and other pad segments not connected to interconnections.

Since the semiconductor package according to the present invention comprises a pad to which an external connection terminal is bonded by a plurality of pad segments and opens sufficient space for passing an interconnection between pad segments, it is possible to easily lay interconnections at the interconnection layer and possible to increase the freedom of laying the interconnections.

Each of the plurality of pad segments forming a pad is smaller than the pad in size. On the other hand, there is no need to reduce the external connection terminal in accordance with the size of the pad segments. The external connection terminal has a size corresponding to the pad formed by the plurality of pad segments, that is, a size covering all of the plurality of pad segments.

Therefore, the external connection terminal is not only bonded with the pad segments (at least one) connected with interconnections, but is also bonded with other pad segments not connected to interconnections. The bonding strength with the external connection terminal of the pad as a whole formed by the plurality of pad segments is secured and a sufficient reliability of connection between the pad and external connection terminal can be secured.

Further, since there is no need for reducing the size of the external connection terminal corresponding to the pad segments and the size may be one corresponding to the pad as a whole, when mounting the package to a motherboard or other mounting board, a bonding strength can be secured between the external connection terminal of the package and the mounting board and a sufficient reliability of connection can be secured.

Further, in the related art, it was necessary to lay the interconnections across two or more interconnection layers, but according to the present invention, it is possible to lay the interconnections at the same interconnection layer, so the disadvantage of the number of the interconnection layers increasing unnecessarily can be eliminated. This contributes to the greater thinness and smaller size of the semiconductor package.

Further, when assigning individual external connection terminals for individual signal, power, and ground use, for example, it is possible to pass a signal use interconnection between the plurality of pad segments forming a pad to which an external connection terminal assigned for ground use is connected, so it is possible to reduce the cross-talk noise etc. between signal interconnections by the ground shielding effect.

According to a second aspect of the present invention, there is provided a processing of producing a semiconductor package comprising the steps of forming a plurality of pad segments forming each pad to which each external connection terminal is bonded while opening up spaces sufficient for passing interconnections therebetween when forming an interconnection layer including interconnection patterns and pads on an insulating substrate or insulating layer, forming a protective layer covering the interconnection layer except at portions of pads formed by the plurality of pad segments and the insulating substrate or insulating layer, and bonding one external connection terminal to each pad formed by the plurality of pad segments exposed from the protective layer.

According to a third aspect of the present invention, there is provided a semiconductor module comprised of a semiconductor package of the present invention and a semiconductor chip mounted on a surface of the package opposite to the surface where the external connection terminals are bonded so that the electrode terminals of the semiconductor chip are electrically connected to the interconnection layer.

BRIEF DESCRIPTION OF THE DRAWINGS

These and other objects and features of the present invention will become clearer from the following description of the preferred embodiments given with reference to the attached drawings, wherein:

FIG. 4 shows, in sectional views, steps of production of the semiconductor package of FIG. 3;

FIG. 5 shows, in sectional views, steps of production following the steps of FIG. 4;

FIG. 6 shows, in sectional views, steps of production following the steps of FIG. 5;

FIG. 9 is a sectional view of the configuration of a semiconductor package according to still another embodiment of the present invention.

DESCRIPTION OF THE PREFERRED EMBODIMENTS

Figure 1:
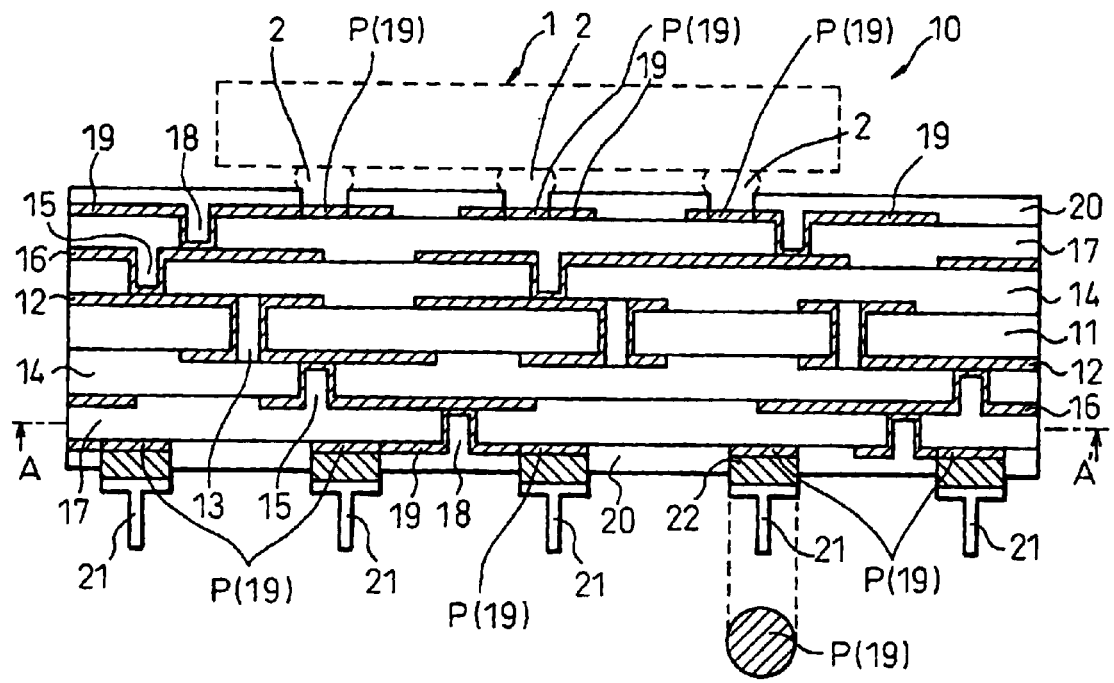
FIG. 1 is a sectional view of the configuration of a semiconductor package according to an example of the related art.
Figure 2:
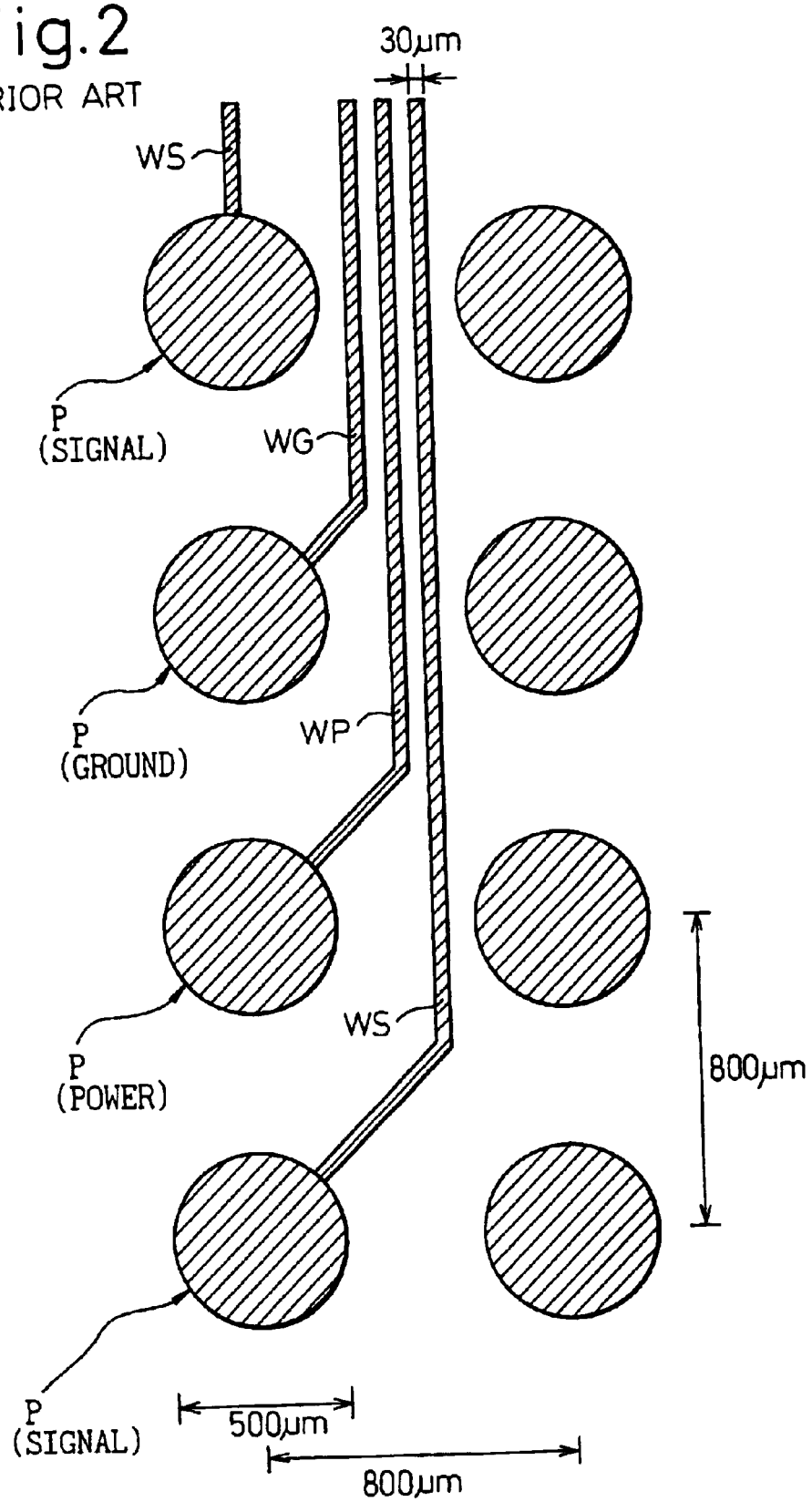
FIG. 2 is a view of an example of the layout of interconnections in the semiconductor package of FIG. 1.
Figure 3:
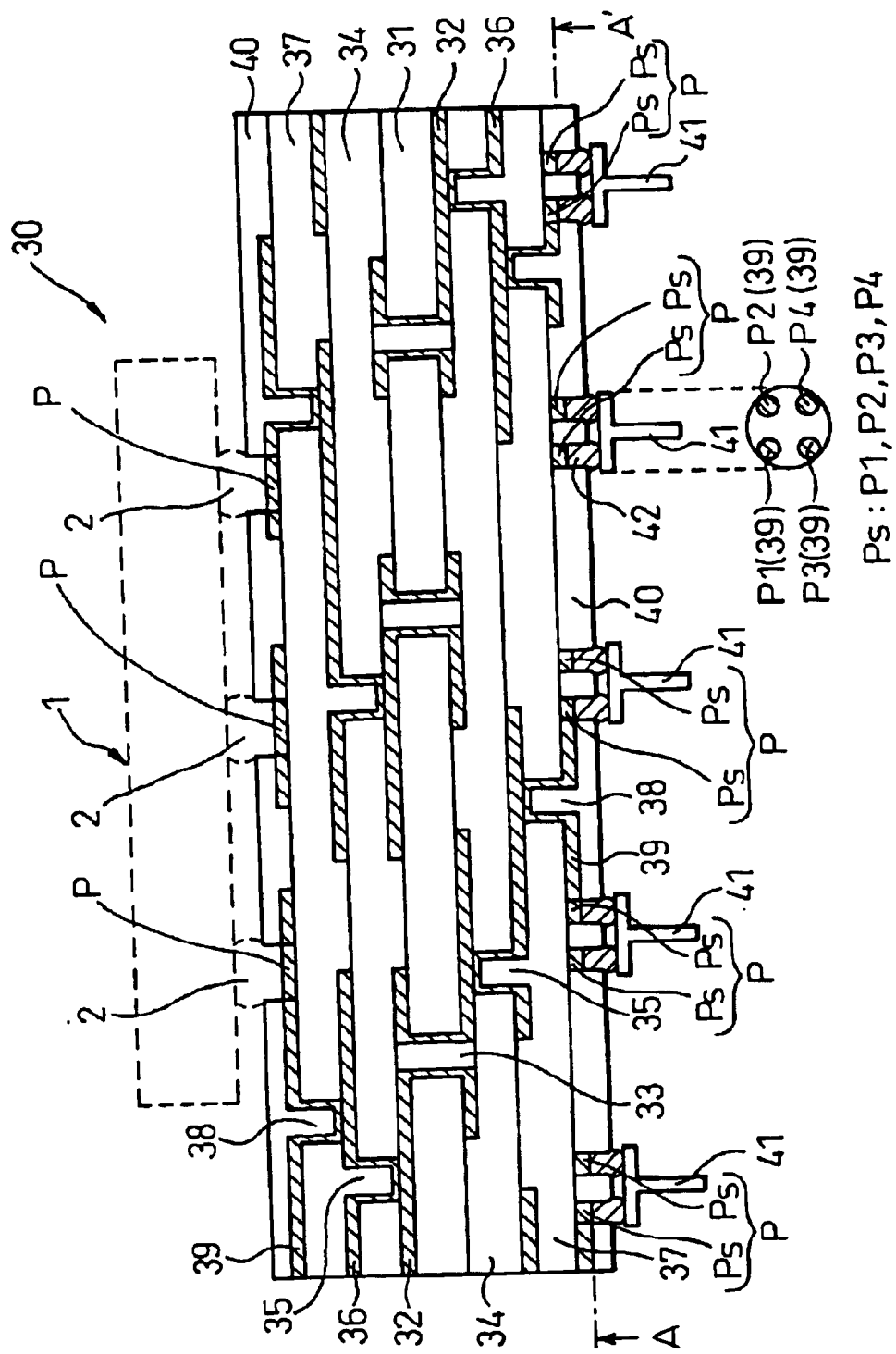
FIG. 3 is a sectional view of the configuration of a semiconductor package according to an embodiment of the present invention.

FIG. 3 shows schematically the configuration of a semiconductor package according to an embodiment of the present invention in the form of a sectional view.

In the figure, 30 indicates a semiconductor package according to the present embodiment. As will be explained later, this has the form of a multilayer printed circuit board obtained using the buildup method (in the illustrated example, a six-layer circuit structure). The semiconductor package 30 mounts a semiconductor chip 1 through electrode terminals 2 (solder bumps, gold (Au) bumps, etc.) as shown by the broken lines.

In the semiconductor package 30, 31 indicates a core board serving as the base of the printed circuit board, 32 conductor layers including interconnection patterns and pads formed by patterning on the two surfaces of the core board 31, 33 a resin (insulator) filled in the through holes formed at required locations of the core board 31, 34 resin layers (insulating layers) forming second buildup layers of the printed circuit board, 35 via holes formed in the resin layers 34 so as to reach the pads of the conductor layers 32, 36 conductor layers including interconnection patterns and pads formed by patterning on the resin layers 34 including the inside walls of the via holes 35, 37 resin layers (insulating layers) forming third buildup layers of the printed circuit board, 38 via holes formed in the resin layers 37 so as to reach the pads of the conductor layers 36, 39 conductor layers including interconnection patterns and pads P formed by patterning on the resin layers 37 including the inside walls of the via holes 38, and 40 solder resist layers serving as protective films (insulating films) formed so as to cover the resin layers 37 and conductor layers 39 except at portions of the pads P of the conductor layers 39.

Further, 41 indicates pins, that is, external connection terminals, for mounting the package 30 to a motherboard or other mounting board, while 42 indicates solder for bonding the pins 41 to the pads P of the conductor layer 39 exposed from the lower solder resist layer 40.

The pads P of the conductor layer 39 exposed from the upper solder resist layer 40 are bonded with the electrode terminals 2 (solder bumps etc.) of the semiconductor chip 1 so as to mount the semiconductor chip 1 to the package 30.

The pads P of the conductor layer 39 exposed from the lower solder resist 40 are bonded with the external connection terminals, that is, pins 41, by solder 42.

The lower pads P are formed by pluralities of pad segments Ps. In the example illustrated, the second pad P from the right in the figure is comprised of four pad segments Ps, that is, P1, P2, P3, and P4, as shown by the planar view along the line A–A'.

Note that copper (Cu) is used as the material of the conductor layers 32, 36, and 39, while for example a heat setting polyimide resin, epoxy resin, polyphenylene ether (PPE) resin, etc. is used as the resin forming the insulator 33 and the insulating layers 34 and 37. Further, Kovar (trademark) plated with nickel (Ni) and gold (Au) (thickness of Ni of about 2 $\mu$m and Au of about 0.2 $\mu$m) is used as the material of the pins 41.

The semiconductor package 30 according to the present embodiment is characterized by forming each of the pads P corresponding to the external connection terminals, that is, the pins 41, by four pad segments Ps, that is, P1, P2, P3, and P4, and opening sufficient space for enabling passage of a signal line, power line, or other interconnection between pad segments Ps.

Next, the process of producing the semiconductor package 30 according to the present embodiment will be explained with reference to FIGS. 4A to 4E to FIGS. 6A to 6C showing steps in the production process.

First, at the first step (see FIG. 4(a)), a core board 31 clad on its two surfaces with copper (Cu) films 32a is provided as the base of the package 30. For example, a board obtained by impregnating a glass fiber cloth with a BT resin, epoxy resin, PPE resin, or other organic resin to form a core board 31 and laminating copper (Cu) foils 32a on its two surfaces (glass cloth-board copper-clad laminate) is prepared.

In the next step (see FIG. 4(b)), through holes 50 are formed at required locations of the copper-clad laminate 31 (32a) using for example a mechanical drill. In this case, depending on the diameter of the through holes to be formed, it is also possible to bore holes using a $CO_2$ laser, excimer laser, etc. instead of using a mechanical drill.

In the next step (see FIG. 4(c)), a conductor layer 32b of Cu is formed over the entire surface (including inside walls of through holes 50) of the copper-clad laminate 31 (32a). This conductor layer 32b is obtained by forming a thin film of a Cu layer over the entire surface by electroless plating of Cu and further stacking a Cu layer over this thin film Cu layer by electroplating of Cu using the thin film Cu layer as a power feed layer. In this case, instead of electroless plating, it is also possible to form the thin film Cu layer by sputtering.

In the next step (see FIG. 4(d)), heat setting polyimide resin, epoxy resin, or other resin (insulator 33) is filled in the through holes 50 (see FIG. 4(c)).

In the next step (see FIG. 4(e)), photosensitive dry films 51 used as an etching resist are heat bonded to the two surfaces of the core board 31 on which the conductor layers (Cu layers) 32b are formed.

In the next step (see FIG. 5(a)), the dry films 51 on the two surfaces are patterned to the shapes of the required interconnection patterns and pads. That is, the resists (dry films 51) are exposed by ultraviolet light (UV) using a mask patterned to the required shape (not shown) and etched away using a predetermined developing solution (developing solution including organic solvent in the case of a negative type resist or alkali-type developing solution in the case of a positive type resist).

In the next step (see FIG. 5(b)), the exposed portions of the Cu layers 32b (not shown, but including the lower Cu foil 32a) are removed by for example wet etching (in this case, using solution able to dissolve Cu) using the patterned dry films 51 as a mask.

In the next step (see FIG. 5(c)), the dry films 51 are peeled off and removed. Due to this, conductor layers (Cu) 32 including the required interconnection patterns and pads are formed on the two surfaces of the core board 31. The conductor layers 32 form the first interconnection layers.

In the next step (see FIG. 5(d)), the steps of forming the insulating layers, forming the via holes in the resin layers, and forming conductor layers including insides of the via holes (patterned interconnection patterns and pads) are sequentially repeated to form further buildup layers.

Specifically, resin films are stacked on the two surfaces of the core board 31, including the conductor layers (Cu layers) 32 and resin (insulator) 33, to form the resin layers (insulating layers) 34, then via holes 35 are formed in the resin layers 34 so as to reach the pads of the conductor layers 32 by laser boring.

Next, Cu thin films are formed by electroless plating of Cu over the entire surface of the resin layers 34 including the inside walls of the via holes 35 and Cu layers are stacked over the Cu thin films by electroplating of Cu using the Cu thin films as power feed layers. Further, in the same way as the processing performed at the steps of FIG. 4E to FIG. 5C, conductor layers (Cu layers) 36 including required interconnection patterns and pads are formed. This conductor layers 36 form the second interconnection layers and are electrically connected with the first interconnection layers (conductor layers 32) through the Cu layers formed over the inside walls of the via holes 35.

In the same way after this, the third resin layers (insulating layers) 37, via holes 38, and Cu interconnection layers (conductor layers 39 including required interconnection patterns and pads) are formed. At this time, the pads P included at the lower conductor layer 39 are formed by the specific layout shown in FIG. 3, that is, by assigning four pad segments Ps: P1 to P4 to each pin 41.

In the next step (see FIG. 6(a)), a photosensitive solder resist is coated by for example screen printing (solder resist layer 40a is formed) on the two surfaces of the printed circuit board where the conductor layers 39 are formed by patterning (that is, to cover the resin layers 37 and conductor layers 39).

In the next step (see FIG. 6(b)), the two solder resist layers 40a are patterned to the shapes of the pads of the corresponding conductor layers 39. That is, the solder resist layers 40a are exposed by ultraviolet light (UV) using a mask patterned to the required shape and etched away using a predetermined developing solution (developing solution including organic solvent in the case of a negative type resist or alkali-type developing solution in the case of a positive type resist).

Due to this, the portions of the solder resist layers 40a corresponding to the regions of the pads P (pad segments Ps) of the conductor layers 39 are opened up to expose only the pads P (pad segments Ps), while the rest of the portions are covered by the solder resist layers 40.

After patterning the solder resist layers 40a in this way, it is desirable to electroplate the exposed pads P (pad segments Ps and conductor layers 39) with nickel (Ni) and gold (Au) using the conductor layers 39 as power feed layers. This is because formation of the Ni/Au layers contributes to improved adhesion when bonding the electrode terminals 2 of the semiconductor chip 1 and adhesion when bonding the pins 41 through the solder 42 at a later stage.

In the final step (see FIG. 6(c)), suitable amounts of paste-like solder 42 are placed on the pads (conductor layer 39) exposed from the lower solder resist layer 40, T-shaped pins 41 having large diameter heads are placed on them with their heads down ("up" in the illustrated example), and these are affixed by reflowing the solder 42 to affix the pins 41.

The above steps gives the semiconductor package 30 (see FIG. 3) of the present embodiment.

Note that when mounting a semiconductor chip 1 on the semiconductor package 30 of the present embodiment to obtain a semiconductor module, the chip is mounted so that the electrode terminals 2 (solder bumps etc.) of the chip 1 are electrically connected to the pads P (pad segments Ps and conductor layer 39) exposed from the upper solder resist layer 40 of the package 30. This can be achieved by flip-chip mounting. Specifically, it can be achieved by anisotropic conductive film (ACF) mounting using an ACF.

Further, when mounting the package 30 to a motherboard or other mounting board, suitable amounts of paste-like solder are placed on the corresponding pads of the board, the legs of the T-shaped pins 41 are placed on them, and these are affixed by reflowing the solder so as to electrically connect the two.

Figure 7:
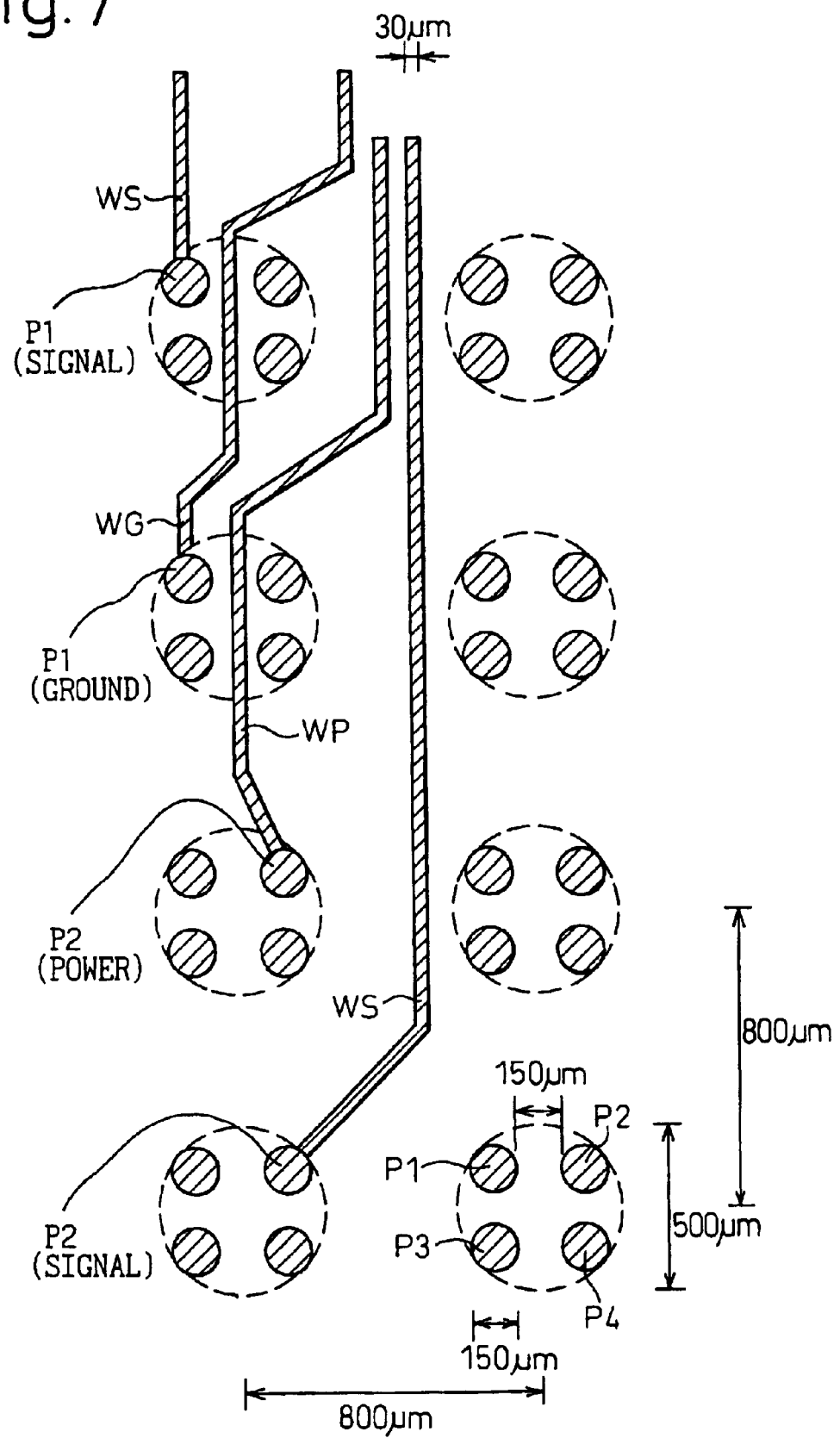
FIG. 7 is a view of an example of the layout of interconnections in the semiconductor package of FIG. 3.

FIG. 7 schematically shows an example of the layout of interconnections in the semiconductor package 30 according to the present embodiment. The interconnections (signal lines WS, power line WP, and ground line WG) and the pads P1 to P4 are formed by patterning the conductor layers 39 (FIG. 3).

As illustrated, four pad segments P1 to P4 are provided corresponding to each pin (shown by broken lines). Each of the interconnections (WS, WP, and WG) is connected to one pad segment among the corresponding pad segments P1 to P4. In the illustrated example, the first signal line WS is connected to the pad segment P1, the ground line WS is connected to the pad segment P1, the power line is connected to the pad segment P2, and the second signal line WS is connected to the pad segment P2.

At the time of connection, the ground line WG is laid to pass between the pad segments including the pad segment 1 to which the first signal line WS is connected, while the power line WP is laid to pass between the pad segments including the pad segment P1 to which the ground line WG is connected.

Note that the mode of passing the interconnections between the pad segments P1 to P4 is of course not limited to the one illustrated in FIG. 7. Further, the pad segments not connected to interconnections (WS, WP, WG) among the pad segments P1 to P4 corresponding to the individual pins are left as dummy pad segments.

In this way, according to the semiconductor package 30 of the present embodiment, since the pad P assigned to each pin 41 is formed by four pad segments P1 to P4 and sufficient space (in the example of FIG. 7, 150 $\mu$m) is secured for enabling passage of an interconnection between the pad segments, it becomes possible to easily lay interconnections at the outermost interconnection layers (in this case, the conductor layers 39). This contributes to the greater freedom of laying of the interconnections.

Further, in the past, it was necessary to lay interconnections across two or more interconnection layers through via holes, but in the present embodiment, the interconnections can be laid at the same interconnection layer, so it is possible to eliminate the disadvantage of an unnecessary increase in the number of interconnection layers such as seen in the related art. This contributes to the reduced thickness of the semiconductor package and in turn contributes to the smaller size of the package.

Further, since it is possible to pass a ground line between pad segments for signal use and pass a power line between the pad segments for ground use as illustrated in FIG. 7, it is possible to effectively suppress cross-talk noise between interconnections and fluctuations in potential etc. of the power line by the ground shielding effect.

The plurality of pad segments forming the pads are smaller in size than the pads. On the other hand, there is no need to make the external connection terminals smaller corresponding to the size of the pad segments. They may be given sizes corresponding to the pads formed by the plurality of pad segments, that is, sizes covering all of the plurality of pad segments.

Therefore, an external connection terminal is not only bonded to at least one pad segment connected to an interconnection, but is also bonded to the other pad segments not connected to interconnections. Therefore, the bonding strength between the external connection terminals of the package and the mounting board is secured and a sufficient reliability of connection is secured for the pad as a whole formed by the plurality of pad segments.

Further, since it is not necessary to reduce the size of the external connection terminals to correspond to the pad segments and enough to make it a size corresponding to the pads as a whole, when mounting the package on a motherboard or other mounting board as well, bonding strength between the external connection terminals of the package and the mounting board is secured and a sufficient reliability of connection is secured.

Further, if the difference in the area of the pads formed at the chip mounting side of the semiconductor package (100 $\mu$m diameter) and the area of the pads formed at the external connection terminal bonding side (500 $\mu$m diameter) is large as in the related art, it is necessary to separately control the thickness of the plating layers (conductor layers) forming the pads at the two surfaces of the package. As opposed to this, according to the semiconductor package 30 of the present embodiment, since the difference in area between the pads at the two surfaces becomes smaller (pad diameter of 100 μm at chip mounting side as compared with pad segment diameter of 150 μm at external connection terminal bonding side), there is the merit that control of the thickness of the plating layers becomes easier.

In the above embodiment, the explanation was given of the case of use of pins 41 as the external connection terminals for mounting the semiconductor package 30 to the motherboard etc., but the external connection terminals are of course not limited to these. For example, they may also take the form of balls or lands as seen in ball grid arrays (BGAS) or land grid arrays (LGAs). An example is shown in FIG. 8.

Figure 8:
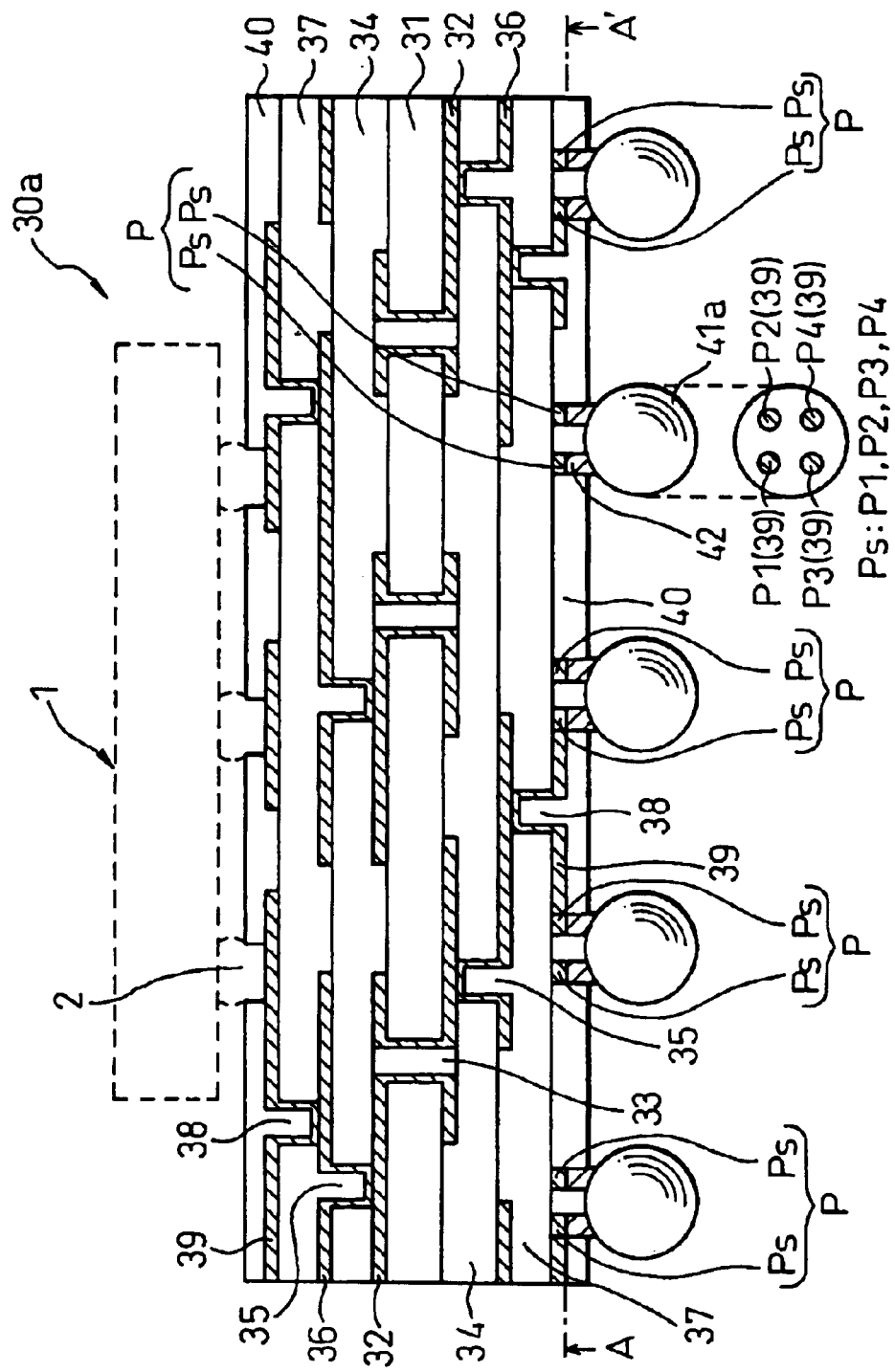
FIG. 8 is a sectional view of the configuration of a semiconductor package according to another embodiment of the present invention.

FIG. 8 schematically shows the configuration of a semiconductor package 30a in the case of use of solder balls 41a as the external connection terminals. The rest of the configuration is the same as the case of the above embodiment (FIG. 3), so explanations will be omitted.

FIG. 9 schematically shows the configuration of a semiconductor package 30b in the case of use of solder balls 41a as the external connection terminals in the same way as FIG. 8. The semiconductor package 30b differs from the configuration of the semiconductor package 30a of FIG. 8 in that a signal interconnection 39S is passed through the plurality of pad segments corresponding to the external connection terminal (solder ball 41a) assigned for ground use and that the ground use interconnection 39G is connected so as to surrounding the signal interconnection 39S at the lower layer. The rest of the configuration is the same as the case of FIG. 8, so explanations will be omitted.

Further, in the above embodiments, the explanation was given taking as an example a multilayer printed circuit board obtained by the buildup method as an embodiment of the semiconductor packages 30, 30a, and 30b, but as clear from the gist of the present invention, the form of the package is of course not limited to this. The point is that it be a package for which smaller size and greater thinness are demanded. The present invention can be similarly applied regardless of whether the package is a multilayer circuit structure or a single-layer circuit structure (structure with single interconnection layer formed on insulating substrate) or regardless of whether it is formed by the buildup method in the case of multiple layers.

Further, in the above embodiments, the explanation was given of the case of forming the pads corresponding to the individual external connection terminals (pins 41, solder balls 41a) by four pad segments P1 to P4 each, but as clear from the gist of the present invention, the number of the pad segments forming the individual pads assigned to the individual terminals is not limited to four. The point is that a pad corresponding to one external connection terminal be formed by a plurality of pad segments and that sufficient space be secured for an interconnection to be laid between the pad segments. Therefore, the number of the pad segments forming one pad may be suitably selected as two, six, etc. as well in accordance with the design conditions of the package.

Further, in the above embodiments, a substrate using glass fiber cloth as a base (core board 31) was used as the base for the semiconductor packages 30, 30a, and 30b, but the base is not limited to this. For example, it is also possible to use a tape (TAB) substrate of a polyimide resin etc.

Further, in the above embodiments, configurations were illustrated in the state with the electrode terminals 2 (solder bumps etc.) exposed when mounting the semiconductor chip to the semiconductor packages 30, 30a, and 30b (FIG. 3, FIG. 8, and FIG. 9), but it is of course also possible to suitably fill an underfill normally used in this art at the portions around the electrode terminals.

As explained above, according to the present invention, by forming the pads assigned to the individual external connection terminals by pluralities of pad segments and securing space of an extent allowing passage of interconnections between pad segments, it is possible to raise the freedom of laying of interconnections, help reduce the size and thickness of the semiconductor package, secure sufficient reliability of connection, and contribute to the reduction of cross-talk noise etc.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-130840, filed on Apr. 27, 2001, the disclosure of which is expressly incorporated herein by reference in its entirety.

What is claimed is:

1. A semiconductor package comprising:
    a conductive layer patterned to form a plurality of interconnections and a plurality of pads on an insulating substrate or insulating layer,
    wherein:
        each pad comprises a plurality of pad segments that are spaced to allow at least one interconnection to pass between predetermined pad segments of each pad,
        at least one pad segment of each pad is connected to an interconnection, and
        an external connection terminal is bonded to each plurality of pad segments of each pad; and
    a protective layer covering said conductive layer except at a portion of each said pad and said insulating substrate or insulating layer.

2. A semiconductor package as set forth in claim 1, wherein each external connection terminal is assigned for signal use, power use, or ground use and an interconnection for signal use is passed between the plurality of pad segments forming a pad to which an external connection terminal assigned for ground use is connected.

3. A semiconductor package as set forth in claim 2, where said ground use interconnection surrounds said signal use interconnection at a lower layer.

4. A semiconductor package as set forth in claim 1, wherein each external connection terminal is assigned for signal use, power use, or ground use and an interconnection for power use is passed between the plurality of pad segments forming a pad to which an external connection terminal assigned for ground use is connected.

5. A semiconductor package as set forth in claim 1, wherein a width of said interconnections is 30 μm and a space sufficient for passing said interconnection is 150 μm.

6. A semiconductor module comprised of a semiconductor package of claim 1 and a semiconductor chip mounted on a surface of the package opposite to the surface where external connection terminals are bonded so that the electrode terminals of said semiconductor chip are electrically connected to said interconnection layer.

7. A semiconductor package comprising:
    an insulating substrate including at least one resin layer thereon;

conductor layers having interconnections formed on one side of the at least one resin layer to connect with conduction layers formed on another side of the at least one resin layer;

pads formed on one side of the at least one resin layer, wherein:

each pad comprises a plurality of pad segments that are spaced to allow at least one interconnection to pass between predetermined pad segments of each pad, at least one pad segment of each pad is connected to an interconnection, and an external connection terminal is bonded to each plurality of pad segments; and a protective layer covering the conductor layers and portions of the pad while exposing a portion of the pad to be connected to a corresponding external connection terminal.

* * * * *

UNITED STATES PATENT AND TRADEMARK OFFICE
CERTIFICATE OF CORRECTION

PATENT NO.   : 6,803,664 B2
DATED        : October 12, 2004
INVENTOR(S)  : Kei Murayama It is certified that error appears in the above-identified patent and that said Letters Patent is hereby corrected as shown below:

Column 10,
Lines 26 and 27, change "interconnections and" to -- interconnection lines and --.
Line 32, change "to allow" to -- with --.
Line 32, change "to pass" to -- line --.
Lines 35, 43, 52, 58 and 64, after "interconnection" insert -- line --.
Lines 48 and 49, after "interconnection" insert -- line --.
Line 57, change "interconnections" to -- interconnection lines --.

Column 11,
Line 1, change "interconnections" to -- interconnection lines --.
Line 2, change "to connect with" to -- connecting with --.
Line 8, change "to allow" to -- with --.
Line 9, change "to pass" to -- line --.

Column 12,
Line 2, after "interconnection" insert -- line --.

Signed and Sealed this

Twenty-seventh Day of September, 2005

JON W. DUDAS
*Director of the United States Patent and Trademark Office*